(12) United States Patent
Kamruzzaman

(10) Patent No.: US 9,842,059 B2
(45) Date of Patent: Dec. 12, 2017

(54) WEAR LEVELING IN STORAGE DEVICES

(71) Applicant: Western Digital Technologies, Inc., Irvine, CA (US)

(72) Inventor: Md Kamruzzaman, Cupertino, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 77 days.

(21) Appl. No.: 15/098,668

(22) Filed: Apr. 14, 2016

(65) Prior Publication Data

US 2017/0300423 A1    Oct. 19, 2017

(51) Int. Cl.
*G06F 12/10* (2016.01)
*G06F 12/109* (2016.01)
*G06F 12/02* (2006.01)

(52) U.S. Cl.
CPC ........ *G06F 12/109* (2013.01); *G06F 12/0253* (2013.01); *G06F 2212/656* (2013.01); *G06F 2212/657* (2013.01); *G06F 2212/7201* (2013.01); *G06F 2212/7205* (2013.01); *G06F 2212/7211* (2013.01)

(58) Field of Classification Search
None
See application file for complete search history.

(56) References Cited

U.S. PATENT DOCUMENTS

| | | | |
|---|---|---|---|
| 6,000,021 A * | 12/1999 | Saito | ..................... B82Y 10/00 365/185.09 |
| 6,732,221 B2 | 5/2004 | Ban | |
| 8,095,724 B2 | 1/2012 | Ji et al. | |
| 8,356,152 B2 | 1/2013 | You | |
| 8,656,118 B2 | 2/2014 | Franceschini et al. | |
| 2004/0083335 A1* | 4/2004 | Gonzalez | ............ G06F 12/0246 711/103 |

(Continued)

OTHER PUBLICATIONS

Micron Technology, Inc., "TN-29-61: Wear Leveling in NAND Flash Memory Introduction," Oct. 2010, Retrieved from https://www.micron.com/~/media/documents/products/technical-note/nand-flash/tn2961_wear_leveling_in_nand.pdf, 5 pgs.
Jung et al., "A Group-Based Wear-Leveling Algorithm for Large-Capacity Flash Memory Storage Systems", CASES'07, Sep. 30-Oct. 3, 2007, Retrieved from http://citeseerx.ist.psu.edu/viewdoc/download?doi=10.1.1.109.4386&rep=rep1&type=pdf, 5 pgs.

*Primary Examiner* — Mano Padmanabhan
*Assistant Examiner* — Jean Edouard
(74) *Attorney, Agent, or Firm* — Patterson & Sheridan, LLP

(57) ABSTRACT

A system may include a plurality of memory cells and a processor. The plurality of memory cells may include a plurality of physical locations at which data is stored. The processor may be configured to determine whether to swap physical locations of data stored at logical block addresses in the first logical block address collection and physical locations of data stored at logical block addresses in the second logical block address collection. The processor may be further configured to, in response to determining to swap the physical locations of the data, swap the physical locations of the data stored at the logical block addresses in the first logical block address collection and the physical locations of the data stored at the logical block addresses in the second logical block address collection.

13 Claims, 6 Drawing Sheets

(56) References Cited

U.S. PATENT DOCUMENTS

| | | | |
|---|---|---|---|
| 2008/0313505 A1* | 12/2008 | Lee | G06F 12/0246 |
| | | | 714/47.2 |
| 2008/0320214 A1* | 12/2008 | Ma | G06F 3/0613 |
| | | | 711/103 |
| 2009/0164702 A1* | 6/2009 | Kern | G06F 12/0246 |
| | | | 711/103 |
| 2009/0193184 A1* | 7/2009 | Yu | G06F 12/0246 |
| | | | 711/103 |
| 2009/0248962 A1* | 10/2009 | Kim | G06F 12/0246 |
| | | | 711/103 |
| 2010/0017649 A1 | 1/2010 | Wu et al. | |
| 2010/0161880 A1* | 6/2010 | You | G11C 16/349 |
| | | | 711/103 |
| 2011/0161622 A1* | 6/2011 | Maeda | G06F 12/1027 |
| | | | 711/207 |
| 2011/0213921 A1* | 9/2011 | Yu | G06F 3/061 |
| | | | 711/103 |
| 2012/0191927 A1 | 7/2012 | Gorobets et al. | |
| 2012/0210095 A1* | 8/2012 | Nellans | G06F 12/1072 |
| | | | 711/206 |
| 2013/0166827 A1 | 6/2013 | Cideciyan et al. | |
| 2013/0326148 A1* | 12/2013 | Fang | G06F 12/0246 |
| | | | 711/133 |
| 2015/0106551 A1* | 4/2015 | Kim | G06F 12/0246 |
| | | | 711/103 |

* cited by examiner

WEAR LEVELING IN STORAGE DEVICES

TECHNICAL FIELD

This disclosure relates to data storage management.

BACKGROUND

Solid-state drives (SSDs) may be used in computers in applications where relatively low latency and high capacity storage are desired. Additionally, SSDs may utilize multiple, parallel data channels to read from and write to memory devices, which may result in high sequential read and write speeds.

SSDs may utilize non-volatile memory (NVM) devices, such as flash, PCM, ReRAM, or MRAM memory devices. In some examples, an SSD may write data to a particular memory device more often than the SSD writes data to other memory devices. Writing data to NVM devices many times over many writes may cause physical changes to the NVM memory device, which may cause the NVM memory device to lose the ability to store data. Some SSDs utilize wear leveling techniques to prevent a particular NVM 1 memory device from being written to much more frequently than other NVM memory devices in an attempt to prolong the lifespan of the NVM memory devices.

SUMMARY

In one example, a system includes a plurality of memory devices and a processor. The plurality of memory devices include a plurality of physical locations at which data is stored. The processor may be configured to determine, based on a value of a first transient write counter associated with a first logical block address collection and a value of a second transient write counter associated with a second logical block address collection, whether to swap physical locations of data stored at logical block addresses in the first logical block address collection and physical locations of data stored at logical block addresses in the second logical block address collection. The value of the first transient write counter may equal a number of times data has been written to the first logical block address collection since a prior data swap involving the first logical block address collection, and the value of the second transient write counter may equal a number of times data has been written to the second logical block address collection since a prior data swap involving the second logical block address collection. The processor may be further configured to, in response to determining to swap the physical locations of the data stored at logical block addresses in the first logical block address collection and the physical locations of the data stored at logical block addresses in the second logical block address collection, swap the physical locations of the data stored at the logical block addresses in the first logical block address collection and the physical locations of the data stored at the logical block addresses in the second logical block address collection.

In another example, a method may include determining, by a processor, based on a value of a first transient write counter associated with a first logical block address collection and a value of a second transient write counter second logical block address collection associated, whether to swap physical locations of data stored in the first logical block address collection and physical locations of data stored in the second logical block address collection. The value of the first transient write counter may equal a number of times data has been written to the first logical block address collection since a prior data swap involving the first logical block address collection, and the value of the second transient write counter may equal a number of times data has been written to the second logical block address collection since a prior data swap involving the second logical block address collection. The method may further include, in response to determining to swap the physical locations of the data stored at logical block addresses in the first logical block address collection and the physical locations of the data stored at logical block addresses in the second logical block address collection, causing, by the processor, the physical locations of the data stored at the logical block addresses in the first logical block address collection to be swapped with the physical locations of the data stored at the logical block addresses in the second logical block address collection.

In another example, a computer-readable storage medium stores instructions that, when executed, cause a processor to determine, based on a value of a first transient write counter associated with a first logical block address collection and a value of a second transient write counter associated with a second logical block address collection, whether to swap physical locations of data stored in a first logical block address collection of a storage device and physical locations of data stored in a second logical block address collection of a storage device. The value of the first transient write counter may equal a number of times data has been written to the first logical block address collection since a prior data swap involving the first logical block address collection, and the value of the second transient write counter may equal a number of times data has been written to the second logical block address collection since a prior data swap involving the second logical block address collection. The instructions may further cause the processor to, in response to determining to swap the physical locations of the data stored at logical block addresses in the first logical block address collection and the physical locations of the data stored at logical block addresses in the second logical block address collection, cause the physical locations of the data stored at the logical block addresses in the first logical block address collection to be swapped with the physical locations of the data stored at the logical block addresses in the second logical block address collection.

The details of one or more examples are set forth in the accompanying drawings and the description below. Other features, objects, and advantages will be apparent from the description and drawings, and from the claims.

DETAILED DESCRIPTION

Figure 1:
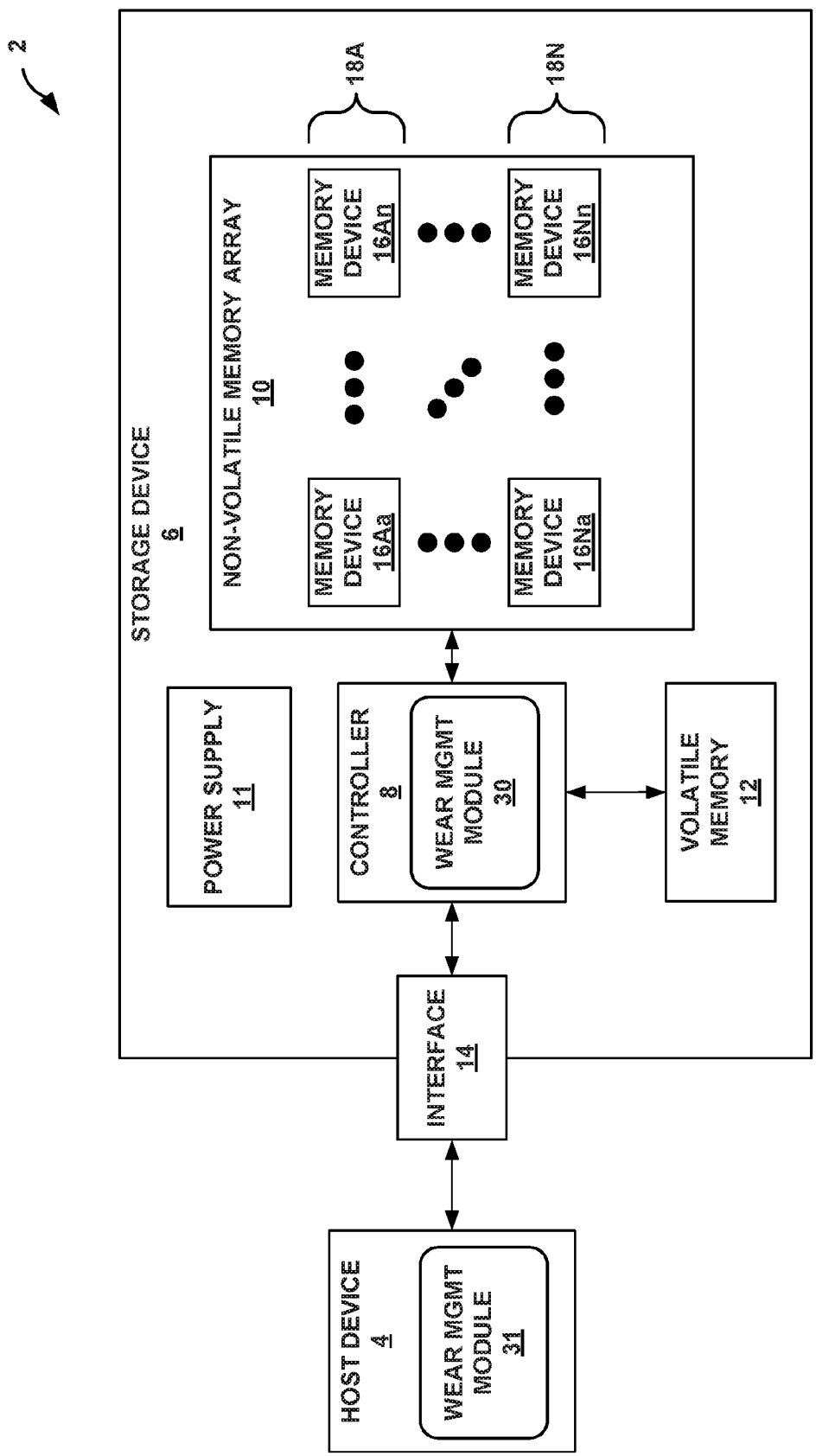
FIG. 1 is a conceptual and schematic block diagram illustrating an example system including a storage device connected to a host device.

The disclosure describes techniques for performing wear leveling for a storage device, such as a solid state drive (SSD), which may help increase longevity of the storage device. A storage device may include a plurality of memory devices that each includes a plurality of physical blocks. A host device storing data to the storage device may utilize logical block addresses, which the storage device translates to physical block addresses using, e.g., an indirection or logical-to-physical table. In wear leveling techniques described herein, sets of logical block addresses may be associated in a logical block address collection. A processor, such as a processor in the controller of the storage device, may maintain a write counter associated with each logical block address collection, and may swap data between physical block addresses associated with different logical block address collections based on the value of the write counter for the respective logical block address collection. Based on the write counter of the respective logical block address collection, the processor may determine whether to swap data from the respective logical block address collection to physical block addresses associated with logical block addresses in another logical block address collection to level writes across logical block address collections.

For example, the write counter may be a transient write counter, and may be a count of writes associated with the respective logical block address collection since the last time data from the respective logical block address collection was swapped with data from another logical block address collection. A high transient write counter value thus indicates that the respective logical block address collection has been written to frequently since the last data swap. In some instances, this may suggest that the respective logical block address collection will be written to frequently in the near future, such that swapping the data stored at logical block addresses in the respective logical block address collection to physical block addresses associated with logical block addresses in another logical block address collection will effectively spread writes across the physical block addresses of the memory devices. Thus, the processor may swap physical locations (physical block addresses) of data from the respective logical block address collection with physical locations (physical block addresses) of data from another logical block address collection that has a lower transient write counter value. In some examples, in addition to basing the determination on the transient write counter value, the processor additionally may base the determination of whether to swap data between physical locations associated with different logical block address collections on a permanent write count value, which tracks a number of writes to a logical block address collection prior to the last data swap involving the logical block address collection.

Maintaining write counters for logical block address collections rather than individual logical blocks may consume less space overhead compared to maintaining write counters for each respective logical block. Similarly, maintaining write counters for logical block collections rather than continuously swapping data between physical blocks may reduce a number of writes for each physical block while still providing sufficient wear leveling. By utilizing less space overhead for the write counters and moving data between physical blocks of the storage device less frequently, techniques of the disclosure may improve the longevity and performance of the storage device.

In some examples, the processor may additionally and optionally rearrange physical locations (e.g., physical blocks) of data within a logical block collection to reduce the probability of writing data to a particular physical location associated with the logical block address collection much more frequently than other physical locations associated with the logical block address collection. By moving physical locations of data within a particular logical block address collection, techniques of this disclosure may reduce the probability of certain physical locations associated with a logical block address collection wearing out prematurely.

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, which may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store data to and/or retrieve data from one or more storage devices, such as storage device 6. As illustrated in FIG. 1, host device 4 may communicate with storage device 6 via interface 14. Host device 4 may include any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1, storage device 6 may include controller 8, non-volatile memory array 10 (NVMA 10), power supply 11, volatile memory 12, and interface 14. In some examples, storage device 6 may include additional components not shown in FIG. 1 for sake of clarity. For example, storage device 6 may include a printed board (PB) to which components of storage device 6 are mechanically attached and which includes electrically conductive traces that electrically interconnect components of storage device 6, or the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.), M.2, or the like. In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA), and parallel-ATA (PATA)), Fibre Channel, small computer system interface (SCSI), serially attached SCSI (SAS), peripheral component interconnect (PCI), PCI-express, Non-Volatile Memory Express (NVMe), or the like. The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit storage device 6 to receive power from host device 4.

Storage device 6 includes NVMA 10, which includes a plurality of memory devices 16Aa-16Nn (collectively, "memory devices 16"). Each of memory devices 16 may be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 16 may be referred to as a die. In some examples, a single physical chip may include a plurality of dies (i.e., a plurality of memory devices 16). In some examples, each of memory devices 16 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, memory devices 16 may include any type of non-volatile memory devices. Some examples of memory devices 16 include, but are not limited to flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices. Unlike flash memory devices, PCM devices, ReRAM devices, MRAM devices, and F-RAM devices may not require stale block reclamation (e.g., garbage collection), but still may utilize wear leveling to reduce effects of limited write endurance of individual memory cells.

In some examples, memory devices 16 may include flash memory devices. Flash memory devices may include NAND or NOR based flash memory devices, and may store data based on a charge contained in a floating gate of a transistor for each flash memory cell. In NAND flash memory devices, the flash memory device may be divided into a plurality of blocks which may be divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. In some examples, controller 8 may write data to and read data from NAND flash memory devices at the page level and erase data from NAND flash memory devices at the block level. Additional details of memory devices 16 are discussed below with reference to FIG. 2.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16An may be grouped into first channel 18A, and memory devices 16Na-16Nn may be grouped into $N^{th}$ channel 18N. The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 18. In this way, the number of separate connections between controller 8 and memory devices 18 may be reduced. Additionally, as each channel has an independent set of connections to controller 8, the reduction in connections may not significantly affect the data throughput rate as controller 8 may simultaneously issue different commands to each channel.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like.

Storage device 6 also may include volatile memory 12, which may be used by controller 8 to store information. In some examples, controller 8 may use volatile memory 12 as a cache. For instance, controller 8 may store cached information in volatile memory 12 until the cached information is written to memory devices 16. Volatile memory 12 may consume power received from power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Storage device 6 includes controller 8, which may manage one or more operations of storage device 6. For example, controller 8 may manage the reading of data from and/or the writing of data to memory devices 16. In some instances, controller 8 may receive a command from host device 4 that includes data and specifies a logical block address (LBA) at which to write the data. Controller 8 may write the data to a physical block address (PBA) of memory devices 16 that corresponds to the LBA specified by host device 4. However, writing data to a particular PBA of a particular memory device 16 many times may cause the particular memory device 16 to wear out faster than other memory devices 16.

In some examples, host 4 includes wear management module (WMM) 31. In other examples, controller 8 includes wear management module (WMM) 30. In other examples, host 4 includes WMM 31 and controller 8 includes WMM 30. WMM 30, 31 may be configured to manage the write locations for data received from host device 4 in order to improve the lifespan of storage device 6 by spreading writes across memory devices 16. For example, WMMs 30, 31 may attempt to distribute writes evenly amongst memory devices 16 by managing the number of writes to a block. In some examples, WMMs 30, 31 may attempt to distribute writes evenly amongst memory devices by managing the number of writes to a logical block address collection, which may include a group of two or more logical block addresses. For example, WMMs 30,31 may swap physical locations at which data associated with a first logical block address collection is stored with physical locations at which data associated with a second logical block address collection is stored if the first logical block address collection has been written many times and the second logical block address collection has been written fewer times.

In some examples, WMMs 30, 31 may maintain a respective transient write counter associated with each logical block address collection, a respective permanent write counter associated with each logical block address collection, and a device write counter associated with NVMA 10. Each respective transient write counter may store a count of the number of times data has been written to the respective logical block address collection over a certain amount of time (e.g., since the last wear leveling operation performed by controller 8 involving the respective logical block address collection). Each respective permanent write counter may store a count of the number of times data has been written to the respective logical block address collection over the life of storage device 6, or over the life of storage device 6 prior to the last wear leveling operation involving the respective logical block address collection. The device write counter may store a count of the number of times data has been written to NVMA 10 (across all block collections). In some examples, the device write counter may count the number of times data has been written to NVMA 10 over the life of NVMA 10.

In some examples, controller 8 includes WMM 30, and controller 8 may receive a write command including data and an LBA from host device 4. Controller 8 may determine a PBA corresponding to the LBA (e.g., based on an indirection or logical-to-physical table) and may write the received data to a memory device 16 at a PBA corresponding to the LBA. Alternatively, controller 8 may write the data to an available PBA (that is not currently storing valid data) and update the indirection table to reflect the LBA-to-PBA correspondence. In some examples, WMM 30 may increment (e.g., increase by one) the value of the device write counter to indicate that controller 6 has performed another write operation and increment the value of the transient write counter associated with the logical block address collection that includes the LBA specified by host device 4. In response to incrementing the value of the device write counter, WMM 30 may determine whether to perform a comparison of the respective transient write counters associated with each respective logical block address collection. For example, WMM 30 may determine whether to perform a comparison of the respective transient write counters by comparing the device write counter to a threshold device write count. If the device write counter satisfies a threshold device write count (e.g., greater than or equal to the threshold write counter, such as 500 thousand writes, 1 million writes, 2 million writes, or the like), WMM 30 may determine whether to swap physical locations (e.g., PBAs) of data stored at LBAs in a first logical block address collection with physical locations (e.g., PBAs) of data stored at LBAs in a second logical block address collection. In some examples, WMM 30 may make the determination based on a value of a first transient write counter associated with the first logical block address collection and a value of a second transient write counter associated with the second logical block address collection.

In response to WMM 30 determining to swap the physical locations of data stored at the first logical block address collection with the physical locations of the data stored at the second logical block address collection, controller 8 may swap the physical locations of the data stored at the first and second logical block address collections. WMM 30 may set the values of the first transient write counter and the second transient write counter equal to a baseline value (e.g., zero). In some examples, WMM 30 may the add the value of the first transient write counter to a value of a first permanent write counter associated with the first logical block address collection prior to setting the first transient write counter to the baseline value. Similarly, WMM 30 may the add the value of the second transient write counter to a value of a second permanent write counter associated with the second logical block address collection prior to setting the second transient write counter to the baseline value. By adding the value of each transient write counter to a respective permanent write counter, WMM 30 may track the total number of writes to each respective logical block address collection. In this way, WMM 30 may track the total number of writes to each respective logical block address collection without updating each respective permanent write counter each time controller 8 writes to a respective logical address block collection.

In some examples, host device 4 may include WMM 31. Host device 4 may send a write command including data and an LBA to controller 8. In response to controller 8 writing data to a memory device 16 at a PBA corresponding to the LBA received from host device 4, WMM 31 may increment the value of the device write counter to indicate that controller 6 has performed another write operation, and may increment the value of the transient write counter associated with the logical block address collection that includes the LBA specified by host device 4. In response to incrementing the value of the device write counter, WMM 31 may determine whether to perform a comparison of the respective transient write counters associated with each respective logical block address collection. For example, WMM 31 may determine whether to perform a comparison of the respective transient write counters by comparing the device write counter to a threshold device write count. If the device write counter satisfies a threshold device write count, WMM 31 may determine whether to swap physical locations of data stored at LBAs in a first logical block address collection with physical locations of data stored at LBAs in a second logical block address collection. In some examples, WMM 31 may make the determination based on a value of a first transient write counter associated with the first logical block address collection and a value of a second transient write counter associated with the second logical block address collection.

In response to WMM 31 determining to swap the physical location of data stored at the first logical block address collection with physical location of data stored at the second logical block address collection, controller 8 may swap physical locations of the data in the first and second logical block address collections. WMM 31 may set the value of the first transient write counter and the second transient write counter equal to a baseline value. In some examples, WMM 31 may the add the value of the first transient write counter and the value of the second transient write counter to a value of respective permanent write counter associated with the respective logical block address collection prior to setting the transient write counters to the baseline value. By adding the value of the transient write counter to a respective permanent write counter, WMM 31 may track the total number of writes to the respective logical block address collection.

In this manner, WMMs 30, 31 may provide improved wear leveling techniques. By maintaining write counters for each logical block address collection rather than each logical block address, WMMs 30, 31 may reduce the number of counters while still providing sufficient wear leveling. Reducing the number of counters may reduce the space overhead consumed by the counters and may improve performance of storage device 6. By swapping physical locations of the data only when a certain logical block address collection has been written more times than another logical block address collection, rather than continuously swapping the physical locations of the data, WMMs 30, 31 may perform wear leveling as needed, which may reduce the amount of unnecessary swapping. By reducing the number of write counters and performing wear leveling as needed, the described techniques may improve the longevity and performance of storage device 6.

Figure 2:
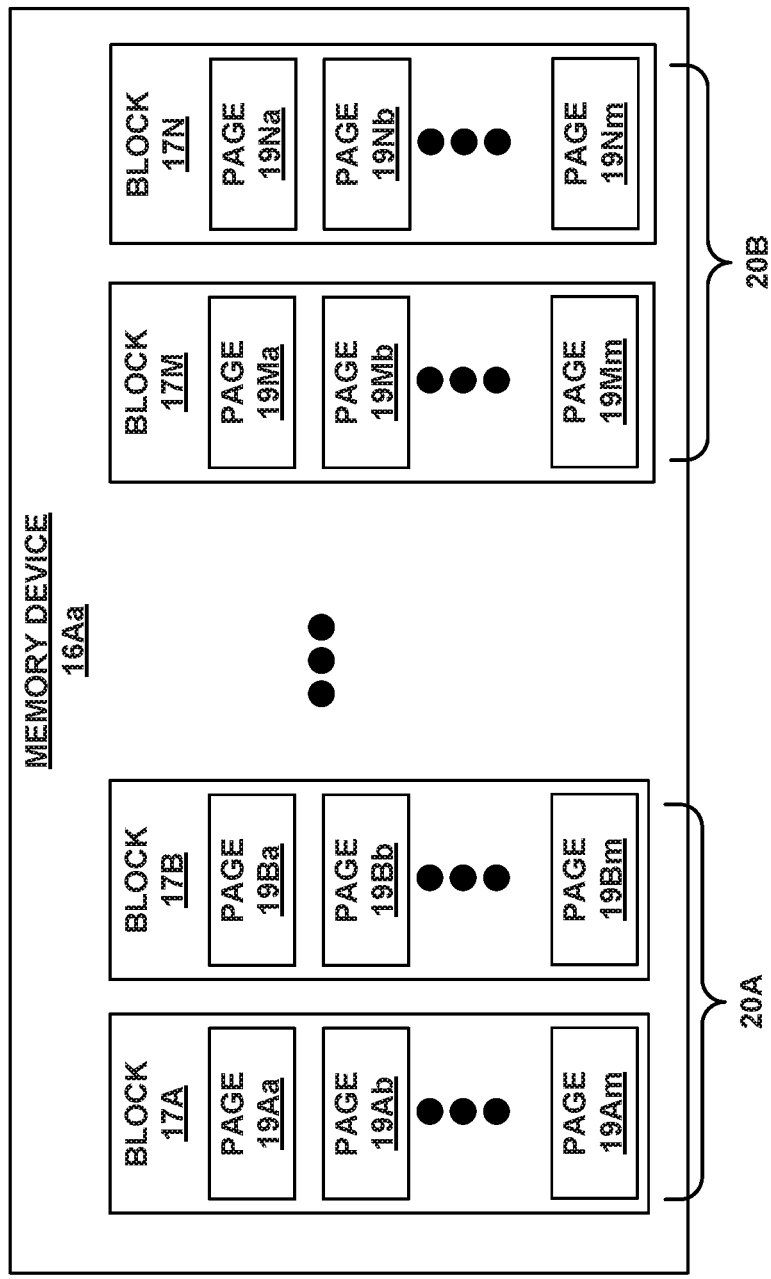
FIG. 2 is a conceptual block diagram illustrating an example memory device, in accordance with one or more techniques of this disclosure.

FIG. 2 is a conceptual block diagram illustrating an example memory device 16Aa that includes a plurality of blocks 17A-17N (collectively, "blocks 17"), each block including a plurality of pages 19Aa-19Nm (collectively, "pages 19"). Each block of blocks 17 may include a plurality of NAND cells. Rows of NAND cells may be serially electrically connected using a word line to define a page (one page of pages 19). Respective cells in each of a plurality of pages 19 may be electrically connected to respective bit lines. Controller 8 may write data to and read data from NAND flash memory devices at the page level and erase data from NAND flash memory devices at the block level. A group of two or more blocks may be referred to a logical block address collection. For example, logical block address collection 20A may include blocks 17A-17B and logical block address collection 20B may include blocks 17M-17N.

Figure 3:
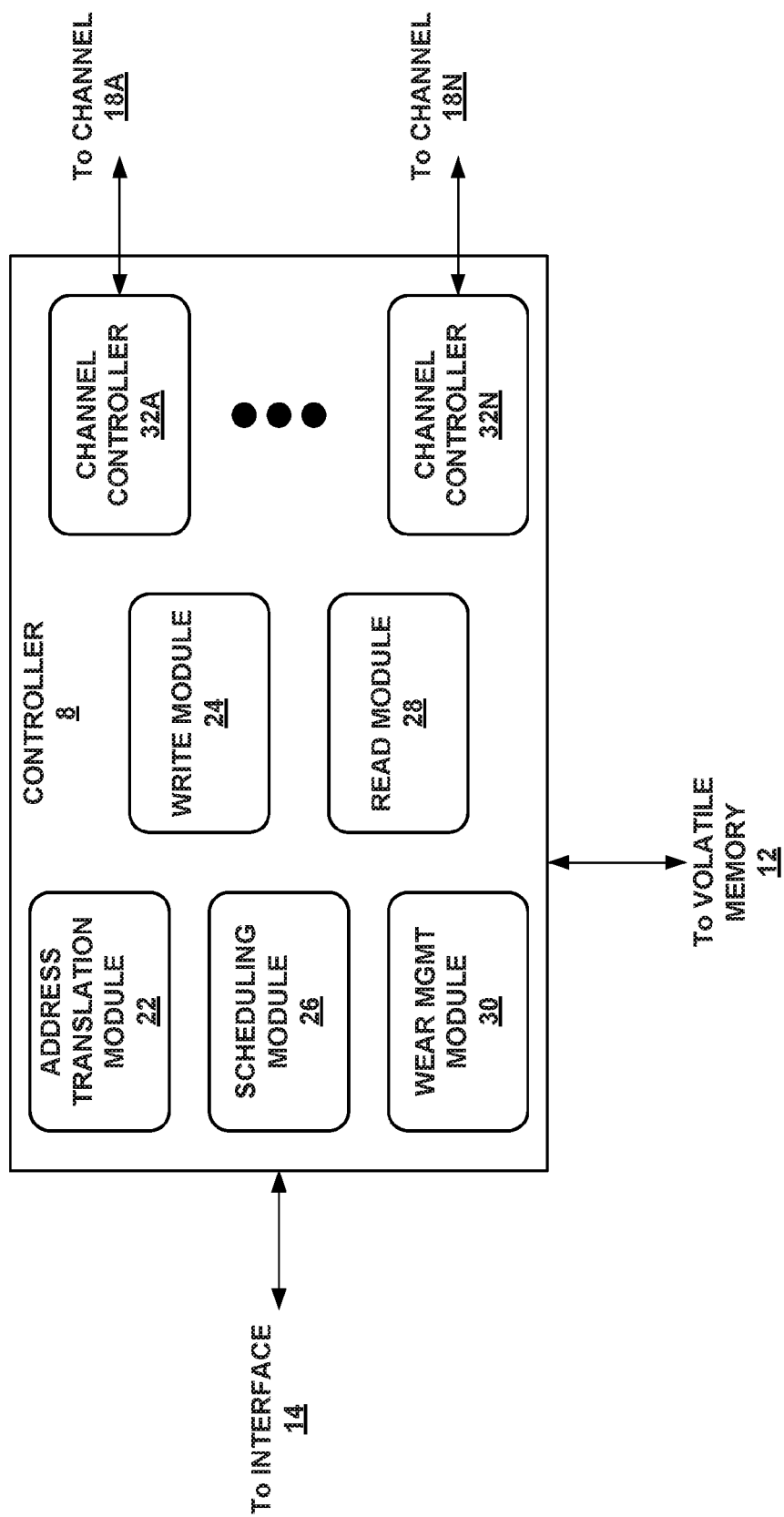
FIG. 3 is a conceptual and schematic block diagram illustrating an example controller.

FIG. 3 is a conceptual and schematic block diagram illustrating example details of controller 8. In some examples, controller 8 may include an address translation module 22, a write module 24, a scheduling module 26, a read module 28, a wear management module (WMM) 30, and a plurality of channel controllers 32A-32N (collectively, "channel controllers 32"). In other examples, controller 8 may include additional modules or hardware units, or may include fewer modules or hardware units. Controller 8 may include one or more microprocessors, digital signal processors (DSP), application specific integrated circuits (ASIC), field programmable gate arrays (FPGA), or other digital logic circuitry.

Controller 8 may interface with the host device 4 via interface 14 and manage the storage of data to and the retrieval of data from memory devices 16. For example, write module 24 of controller 8 may manage writes to memory devices 16. For example, write module 24 may receive a message from host device 4 via interface 14 instructing storage device 6 to store data associated with a logical address and the data, which may be referred to as user data. Write module 24 may manage writing of the user data to memory devices 16.

For example, write module 24 may communicate with address translation module 22, which manages translation between logical addresses used by host device 4 to manage storage locations of data and physical block addresses used by write module 24 to direct writing of data to memory devices. Address translation module 22 of controller 8 may utilize a flash translation layer or indirection table that translates logical addresses (or logical block addresses) of data stored by memory devices 16 to physical block addresses of data stored by memory devices 16. For example, host device 4 may utilize the logical block addresses of the data stored by memory devices 16 in instructions or messages to storage device 6, while write module 24 utilizes physical block addresses of the data to control writing of data to memory devices 16. (Similarly, read module 28 may utilize physical block addresses to control reading of data from memory devices 16.) The physical block addresses correspond to actual, physical blocks of memory devices 16. In some examples, address translation module 22 may store the flash translation layer or table in volatile memory 12.

In this way, host device 4 may be allowed to use a static logical block address for a certain set of data, while the physical block address at which the data is actually stored may change. Address translation module 22 may maintain the flash translation layer or indirection table to map the logical block addresses to physical block addresses to allow use of the static logical block address by the host device 4 while the physical block address associated with the data may change, e.g., due to wear leveling, garbage collection, or the like.

As discussed above, write module 24 of controller 8 may perform one or more operations to manage the writing of data to memory devices 16. For example, write module 24 may manage the writing of data to memory devices 16 by selecting one or more physical blocks within memory devices 16 to store the data and causing memory devices of memory devices 16 that include the selected physical blocks to actually store the data. As discussed above, write module 24 may cause address translation module 22 to update the flash translation layer or indirection table based on the selected physical blocks. For instance, write module 24 may receive a message from host device 4 that includes data and a logical block address, select a physical block within a particular memory device of memory devices 16 to store the data, cause the particular memory device of memory devices 16 to actually store the data (e.g., via a channel controller of channel controllers 32 that corresponds to the particular memory device), and cause address translation module 22 to update the flash translation layer or indirection table to indicate that the logical block address corresponds to the selected physical block within the particular memory device.

Read module 28 may similarly control reading of data from memory devices 16. For example, read module 28 may receive a message from host device 4 requesting data with an associated logical block address. Address translation module 22 may convert the logical block address to a physical block address using the flash translation layer or table. Read module 28 then may control one or more of channel controllers 32 to retrieve the data from the physical block addresses. Similar to write module 24, read module 28 may select one or more physical blocks and communicate a message to channel controllers 32 that may cause channel controllers 32 to read the data from the selected physical blocks.

Scheduling module 26 of controller 8 may perform one or more operations to schedule activities to be performed by memory devices 16. For instance, scheduling module 26 may schedule requests received from other components of controller 8 to command one or more of memory devices 16 to perform one or more activities during run-time. In some examples, scheduling module 30 may schedule the requests to be performed in the order in which they were received (e.g., first-in first-out or FIFO). In some examples, scheduling module 26 may schedule the requests based one or more factors which may include, but are not limited to, the type of request (e.g., a read request, a write request, an erase request, a garbage collection request, etc.), an amount of time elapsed since the request was received, an amount of power that would be consumed by performance of the request, bandwidth considerations, and the like.

Controller 8 may receive a first write command from host device 4 that includes data and at least one logical block address associated with the data. In response to receiving the first write command from host device 4, write module 24 may determine at which physical locations of memory devices 16 to write the data. For example, write module 24 may request from address translation module 22 one or more physical block addresses that are empty (e.g., store no data), partially empty (e.g., only some pages of the physical block store data), or store at least some invalid (or stale) data. Upon receiving the one or more physical block addresses, write module 24 may define and/or select one or more physical blocks, and communicate a message to channel controllers 32A-32N (collectively, "channel controllers 32"), which causes the channel controllers 32 to write the data to the physical blocks.

Each channel controller of channel controllers 32 may be connected to a respective channel of channels 18. In some examples, controller 8 may include the same number of channel controllers 32 as the number of channels 18 of storage device 2. Channel controllers 32 may perform the intimate control of addressing, programming, erasing, and reading of memory devices 16 connected to respective channels, e.g., under control of write module 24 and/or read module 28.

In some examples (e.g., where memory devices 16 include flash memory devices), a large current may be used in order to write a bit with a logical value of 0 (charged) to a bit with a previous logical value of 1 (uncharged). This current may be sufficiently large that it may cause inadvertent changes to the charge of adjacent flash memory cells. To protect against inadvertent changes, an entire block of flash memory cells may be erased to a logical value of 1 (uncharged) prior to writing any data to cells within the block. Because of this, flash memory cells may be erased at the block level and written at the page level. However, writing data and erasing data may cause flash memory cells to wear. For instance, wear to flash memory cells may occur when flash memory cells are erased due to the relatively high voltages used to erase the flash memory cells. Over a plurality of erase cycles, the relatively high voltages may result in changes to the flash memory cells. Eventually, the flash memory cells may wear out, such that data may no longer be written to the cells. Similarly, other types of non-volatile memory (e.g., PCM, ReRAM, MRAM, or the like) may also wear out over time such the memory device may no longer write data to particular cells.

In some examples, controller 8 may perform wear leveling operations to reduce the probability of a particular memory cell wearing out prematurely. By utilizing wear leveling techniques, controller 8 may spread writes among different memory cells, which may help increase the longevity of the memory devices. In some examples, the described wear leveling techniques may apply to any type of NVM (e.g., flash, PCM, ReRAM, MRAM, or the like).

WMM 30 may manage wear leveling operations. In some examples, WMM 30 may manage different types of wear leveling operations. In one example, WMM 30 may manage inter-block collection wear leveling. For example, WMM 30 may perform in inter-block collection wear leveling by periodically moving data associated with a first logical block address collection from a first physical location to a second physical location not associated with the first logical block address collection. For example, WMM 30 may swap the physical location of data stored at logical block addresses in a first logical block address collection with the physical location of data stored at logical block addresses in a second logical block address collection. In another example, WMM 30 may manage intra-block collection wear leveling. For example, WMM 30 may manage intra-block collection wear leveling by periodically rearranging data stored at physical locations associated with the first logical block address collection. For example, WMM 30 may rearrange data stored at physical locations associated with the first logical block address collection by swapping the physical location of data stored at a first logical address (e.g., a logical page, word, or byte) associated with the first logical block address collection and a physical location of data stored at a second logical address (e.g., logical page, word, or byte) associated with first logical block address collection.

In some examples, WMM 30 may determine whether to perform a wear leveling operation based on one or more write counters. For example, WMM 30 may maintain a device write counter, a plurality of transient write counters, and a plurality of permanent write counters. As described above with reference to FIG. 1, the device write counter may store a count of the number of times data has been written to NVMA 10. The plurality of permanent write counters may include a respective permanent write counter associated with each respective logical block address collection of the plurality of logical block address collections. Each respective permanent write counter may store a count of the number of times data has been written to the respective logical block address collection (e.g., over the life of storage device 6 or over the life of storage device 6 prior to the last wear leveling operation involving the respective logical block address collection). Likewise, the plurality of transient write counters may include a respective transient write counter associated with each respective logical block address collection of the plurality of logical block address collections. Each respective transient write counter may store a count of the number of times data has been written to the respective logical block address collection within a certain amount of time (e.g., since the last inter-block collection wear leveling operation involving the respective logical block address collection).

In some examples, WMM 30 may determine whether to perform an inter-block collection wear leveling operation based on a comparison of at least one write counter associated with a first logical block address collection and at least one write counter associated with a second logical block address collection. In some instances, WMM 30 may compare the respective write counters after every write.

In other instances, WMM 30 may compare the respective write counters after a certain number of writes. For example, if the value of the device write counter satisfies a threshold device write count, WMM 30 may determine that a certain number of writes have occurred and that WMM 30 should compare the respective write counters. In some examples, in response to performing a first write, WMM 30 may update (e.g., increment by one) the value of the device write counter and determine whether the value of the device write counter satisfies a threshold device write count.

In some examples, WMM 30 may determine that the device write counter satisfies a threshold if the value stored at the device write counter is equal to or exceeds one of a plurality of threshold device write counts. For instance, WMM 30 may include multiple threshold device write counts (e.g., 500 thousand writes, 1 million writes, 1.5 million writes, or the like). In other words, WMM 30 may determine that the device write counter satisfies the threshold after every 500 thousand writes. Thus, if the device write counter reaches one of the plurality of threshold device write counts, the value of the device write counter may satisfy the threshold and WMM 30 may compare the respective transient write counters.

In other examples, WMM 30 may determine that the device write counter satisfies the threshold if the value stored at the device write counter is greater than or equal to a threshold device write count. For instance, WMM 30 may include a single threshold device write count (e.g., 1 million writes). In response to determining that the value of the device write counter is greater than or equal to the threshold device write count, WMM 30 may reset the device write count to a baseline value (e.g., zero) and compare the respective transient write counters.

In still other examples, WMM 30 may determine that the device write counter satisfies a threshold if the device write counter is divisible by an integer. In some instances, the device write counter may be divisible by an integer if performing a modulo operation of the device write counter and the threshold device write count equals a particular value. The modulo operation may calculate the remainder after dividing the device write counter by the threshold device write count. WMM 30 may, in some examples, determine that the device write counter is divisible by an integer if the remainder equals a particular value (e.g., zero). In some examples, in response to determining that the device write counter satisfies the threshold, WMM 30 may compare the respective transient write counters.

As discussed above, WMM 30 may determine whether to perform an inter-block collection wear leveling operation based on one or more write counters in response to determining that the value of the device write counter satisfies a threshold. WMM 30 may determine whether to perform an inter-block collection wear leveling operation based on a comparison of a first transient write counter associated with a first logical block address collection and a second transient write counter associated with a second logical block address collection. In other words, WMM 30 may determine whether to swap the physical locations of the data stored at logical block addresses in the first logical block address collection and the physical locations of the data stored at logical block addresses in the second logical block address collection based on respective transient write counters associated with the respective logical block address collections. For example, WMM 30 may determine to swap physical locations of the data associated with the respective logical block address collections if the value of the first transient write counter (denoted as $C_{1,TRANS}$) is greater than a predetermined number (denoted as P) multiplied by the value of the second transient write counter (also denoted as $C_{2,TRANS}$). In other words, WMM 30 may determine to swap physical locations of data associated with the respective logical block collections if:

$$C_{1,TRANS} > P * C_{2,TRANS}. \qquad \text{Equation 1:}$$

For example, if $C_{1,TRANS}$=1200, $C_{2,TRANS}$=200, and the predetermined number P equals 5, WMM 30 may determine to swap the physical locations of the data stored at logical block addresses in the first logical block address collection and the physical locations of the data stored at logical block addresses in the second logical block address collection because $C_{1,TRANS}$ (1200) is greater than the predetermined number P multiplied by $C_{2,TRANS}$ (5*200=1000). It should be understood that the predetermined number shown here is given for illustrative purposes only and that other values may be used for the predetermined number.

In some examples, WMM 30 may determine whether to perform an inter-block collection wear leveling operation based on a first transient write counter associated with a first logical block address collection, a first permanent write counter associated with the first logical block address collection, a second transient write counter associated with a second logical block address collection, and a second permanent write counter associated with the second logical block address collection. In other words, WMM 30 may determine whether to swap the physical locations of the data stored at logical block addresses in the first logical block address collection and the physical locations of the data stored at logical block addresses in the second logical block address collection based on respective transient write counters associated with the respective logical block address collections and respective permanent write counters associated with the respective logical block address collections. For example, WMM 30 may sum the value of the first transient write counter ($C_{1,TRANS}$) and the value of the first permanent write counter (denoted as $C_{1,PERM}$) to determine a first total write value (also denoted as $C_{1,TOTAL}$) and may sum the value of the second transient write counter ($C_{2,TRANS}$) and the value of the second permanent write counter (denoted as $C_{2,PERM}$) to determine a second total write value (also denoted as $C_{2,TOTAL}$). WMM 30 may determine to swap physical locations of the data associated with the respective logical block address collections in response to determining the first total write value is greater than a predetermined number P multiplied by the second total write value. In other words, WMM 30 may determine to swap physical locations of the data associated with the respective logical block address collections if:

$$C_{1,TOTAL} > P * C_{2,TOTAL}. \qquad \text{Equation 2:}$$

For example, if $C_{1,TRANS}$=1200, $C_{1,PERM}$=2000, $C_{2,TRANS}$=200, and $C_{2,PERM}$=400, $C_{1,TOTAL}$=3200 and $C_{2,TOTAL}$=600. In this example, if the predetermined number P=5, WMM 30 may determine to swap the physical locations of the data stored at logical block addresses in the first logical block address collection and the physical locations of the data stored at logical block addresses in the second logical block address collection because $C_{1,TOTAL}$ (3200) is greater than the predetermined number P multiplied by $C_{2,TOTAL}$ (5*600=3000).

In some examples, WMM 30 may determine whether to perform an inter-block collection wear leveling operation based on the first total write value, the second total write value, the first transient write value, and the second transient write value. In other words, WMM 30 may determine whether to swap the physical locations of the data stored at logical block addresses in the first logical block address collection and the physical locations of the data stored at logical block addresses in the second logical block address collection based on respective transient write counters associated with the respective logical block address collections and respective total write values associated with the respective logical block address collections. For example, WMM 30 may determine to swap physical locations of the data associated with the respective logical block address collections in response to determining that the first total write value is greater than the predetermined number P multiplied by the second total write value and that value of the first transient write counter is greater than the value of the second transient write counter. In other words, WMM 30 may determine to swap physical locations of the data associated with the respective logical block address collections if:

$$C_{1,TOTAL} > P \cdot C_{2,TOTAL} \text{ and} \qquad \text{Equation 3:}$$

$$C_{1,TRANS} > C_{2,TRANS}. \qquad \text{Equation 4:}$$

For example, if $C_{1,TRANS}=1200$, $C_{1,TOTAL}=3200$, $C_{2,TRANS}=200$, $C_{2,TOTAL}=600$, and the predetermined number P=5, then $C_{1,TOTAL}$ (3200) is greater than the predetermined number multiplied by $C_{2,TOTAL}$ (5*600=3000) and $C_{1,TRANS}$ (1200) is greater than $C_{2,TRANS}$ (200). In this example, WMM 30 may determine to swap the physical locations of the data stored at logical block addresses in the first logical block address collection and the physical locations of the data stored at logical block addresses in the second logical block address collection because both conditions given by Equations 3 and 4 are satisfied.

In response to determining to swap the physical locations of the data stored at logical block addresses in the first logical block address collection and the physical locations of the data stored at logical block addresses in the second logical block address collection, WMM 30 may swap the physical locations of the data stored at logical block addresses in the first logical block address collection and the physical locations of the data stored at logical block addresses in the second logical block address collection. For example, WMM 30 may copy data stored at a first physical location associated with the first transient write counter to a third physical location (e.g., a different memory device 16 or volatile memory 12), copy data stored at the second physical location associated with the second transient write counter to the first physical location, and copy the data from the third physical location to the second physical location. WMM 30 may cause address translation module 22 to update the flash translation layer or indirection table to indicate that the first logical block address collection now corresponds to the second physical location and that the second logical block address collection now corresponds to the first physical location. In further response to determining to perform a wear leveling operation, WMM 30 may reset the value of the first transient write counter and the value of the second transient write counter to a baseline value (e.g., zero).

Controller 8 may receive a second write command including data and a logical block address from host device 4. The logical block address may correspond to a third logical block address collection, which be associated with a third transient write counter and a third permanent write counter. In response to receiving the second write command from host device 4, write module 24 may determine at which physical locations of memory devices 16 to write the data in a manner similar to the manner described above with reference to the first write command. For example, write module 24 may cause the received data to be written at a physical location associated with the third logical block collection. In some examples, in response to writing data associated with the third logical block address collection, WMM 30 may update the third transient write counter.

WMM 30 may determine whether to perform an intra-block collection wear leveling operation based on the value of the third transient write counter or based on the sum of the of the third transient write counter and the value of at the third permanent write counter, the sum being referred to as the third total write value. In other words, WMM 30 may determine whether to rearrange data stored at physical locations associated with the third logical block address collection based on whether the value of at the third transient write counter satisfies a threshold block collect count or the third total write value satisfies a threshold block collection count.

In some examples, WMM 30 may determine that the third transient write counter (or third total write value) satisfies a threshold block collection count if the value of the third transient write counter (or the third total write value) is equal to one of a plurality of threshold block collection counts. For instance, WMM 30 may include multiple threshold block collection counts (e.g., one thousand writes, two thousand writes, or the like). Thus, if the third transient write counter (or the third total write value) reaches one of the plurality of threshold block collection counts, the value of the third transient write counter (or the third total write value) may satisfy the threshold block collection counts and WMM 30 may determine to rearrange data stored at pages associated with the first logical block address collection.

In other examples, WMM 30 may determine that the third transient write counter (or third total write value) satisfies a threshold block collection count if the third transient write counter (or third total write value) is divisible by an integer. In some instances, the third transient write counter (or third total write value) is divisible by an integer if performing a modulo operation of the third transient write counter (or third total write value) and the threshold block collection count equals a particular value. The modulo operation may calculate the remainder after dividing the third transient write counter (or third total write value) by the threshold block collection count. WMM 30 may, in some examples, determine that the third transient write counter (or third total write value) is divisible by an integer if the remainder equals a particular value (e.g., zero). In some examples, in response to determining that the third transient write counter or the third total write value satisfies the threshold block collection count, WMM 30 may WMM 30 may determine to rearrange data stored at pages associated with the first logical block address collection.

It is to be understood that the threshold write counts described herein (whether they be a threshold device write count, a threshold block collection count, or any other threshold write counts described herein) are merely examples and that any value may be used for the various threshold write counts.

In response to determining to rearrange data at physical locations associated with the third logical block address collection, WMM 30 may rearrange the data stored at physical locations associated with the third logical block address collection by swapping the physical location of data stored at a first logical address (e.g., a logical page, word, or byte) associated with the third logical block address collection and a physical location of data stored at a second logical address associated with third logical block address collection. In some examples, WMM 30 may perform the swap based on an offset value associated with the third logical block address collection. For example, WMM 30 may swap data from a first physical location to a second physical location that is offset from the first physical location by the offset value. In some examples, WMM 30 manages a single offset value for all of the logical block address collections. In other examples, WMM 30 may maintain a respective offset value associated with each respective logical block address collection.

In some examples, the offset value may be a fixed offset value. For instance, consider an example where the fixed offset value associated with the third logical block address collection equals 50 and the third logical block address collection includes 256 pages. In this example, in response to determining that the value of the third transient write counter (or the third total write value) satisfies the threshold, WMM 30 may copy a logical unit of data (e.g., a page) of data from a first physical location (e.g., physical page-1) to a second physical location (e.g., physical page-51), a logical unit of data (e.g., a page) from a third physical location (e.g., physical page-2) to a fourth physical location (e.g., physical page-52), and so on. The next time WMM 30 determines to rearrange data stored at physical locations associated with the third logical block address collection, WMM 30 may again copy a logical unit of data (e.g., a page) from the first physical location (e.g., physical page-1) to the second physical location (e.g., physical page-51), a logical unit of data (e.g., a page) from the third physical location (e.g., physical page-2) to the fourth physical location (e.g., physical page-52), and so on. Thus, after two rearranging operations, WMM 30 may have moved a logical page of data that was originally stored physical page-1 to physical page-51 and then to physical page-101.

In other examples, the offset value may be a random offset value. For example, WMM 30 may periodically change the offset value associated with the third logical block address collection. For instance, in some examples, WMM 30 may update the random offset value from a first random offset value (e.g., 50) to a second random offset value (e.g., 121). WMM 30 may update the random value based on a random number generator In some examples, the random number generator may generate a value between 1 and Z, where Z equals a number of physical units of data (e.g., pages, words, or bytes) associated with the logical block address collection. For example, consider an example where the fixed offset value associated with the third logical block address collection initially equals 50 and the third logical block address collection includes 256 pages. In this example, WMM 30 may copy a logical unit of data (e.g., a page) from a first physical location (e.g., physical page-1) to a second physical location (e.g., physical page-51), a logical unit of data (e.g., a page) from a third physical location (e.g., physical page-2) to a third physical location (e.g., physical page-52), and so on. WMM 30 may update the random offset value from a value of 50 to a value of 121. The next time WMM 30 determines to rearrange data stored at physical locations associated with the third logical block address collection, WMM 30 may copy a logical unit of data (e.g., a page) from the first physical location (e.g., physical page-1) to a fifth physical location (e.g., physical page-122), a logical unit of data (e.g., a page) from the third physical location (e.g., physical page-2) to a sixth physical location (e.g., physical page-123), and so on. Thus, after two rearranging operations, WMM 30 may have moved a logical page of data that was originally stored at a physical page-1 to physical page-51 and then to physical page-172.

In some examples, WMM 30 may store the various write counters (e.g., the device write counter, the respective transient write counters, the respective permanent write counters, or any combination therein) in volatile memory 12, NVMA 10, or a combination thereof. In some examples, WMM 30 may store all of the respective transient write counters and the respective permanent write counters in NVMA 10 and may store a subset of the respective transient write counters and permanent write counters in volatile memory 12.

For instance, in response to storage device 6 turning on, WMM 30 may load block collection specific parameters at device start up. In other words, WMM 30 may retrieve a subset of transient write counters, permanent write counters, or both, and may load the subset of transient write counters and permanent write counters to volatile memory 12. In some examples, the subset of write counters may include the respective counters corresponding to the most frequently written logical block address collections, the most frequently read logical block address collections, or both.

WMM 30 may retrieve additional subsets of the write counters associated with respective additional logical block address collections as controller 8 receives write commands or read commands involving the respective additional logical block address collections. In some examples, WMM 30 may retrieve additional subset of writes counters associated with one or more respective additional logical block address collections if controller 8 determines the respective additional logical block address collections are likely to be used, even if controller 8 has not received a command involving the additional one or more logical block address collections. By loading the respective write counters as they are used (or likely to be used), WMM 30 may reduce the number of counters stored in volatile memory 12, which may improve the performance of storage device 6.

In some examples, where WMM 30 loads at least some of the respective write counters to volatile memory 12, WMM 30 may periodically update the respective write counters stored at NVMA 10. WMM 30 may update the respective write counters stored at NVMA 10 when storage device 6 is turned off (e.g., due to an intentional shut off or power failure). In this way, WMM 30 may retain a more accurate count for each of the respective write counters if storage device 6 loses power.

Figures 4A, 4B:
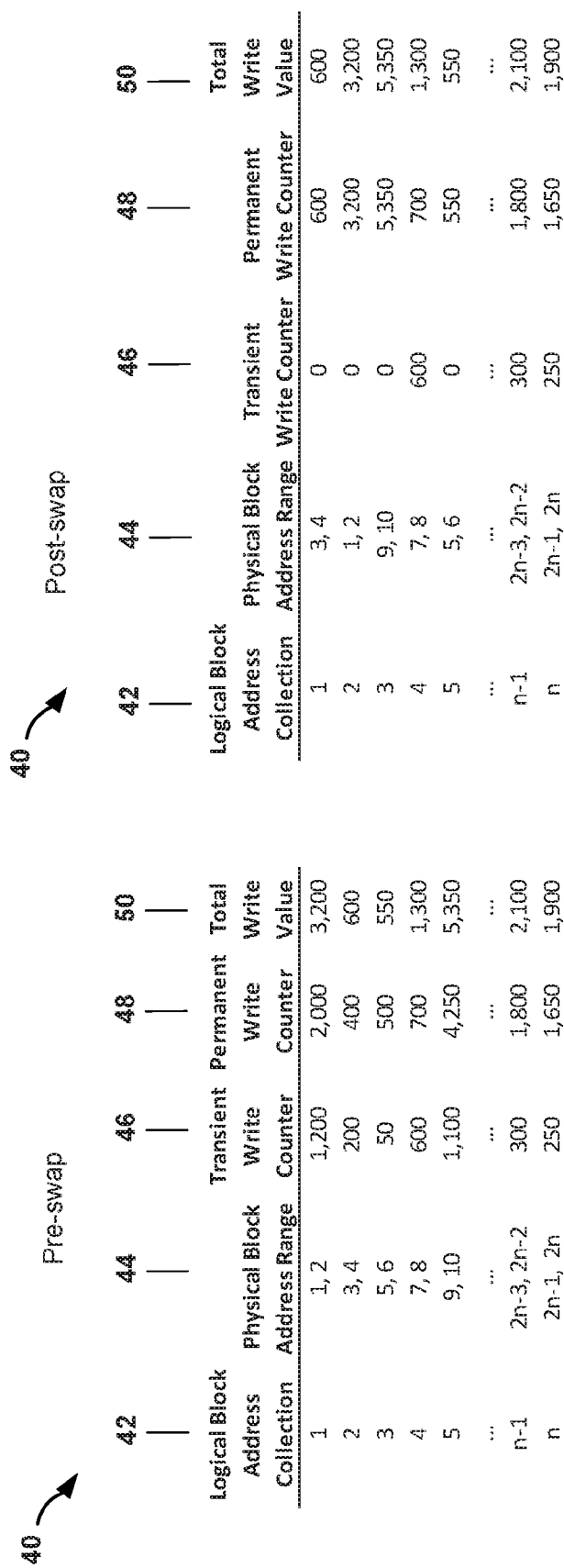
FIGS. 4A-4B are conceptual and schematic block diagram illustrating example details of a write counter table, in accordance with one or more techniques of this disclosure.

FIGS. 4A-4B are conceptual and schematic block diagram illustrating example details of a write counter table, in accordance with one or more techniques of this disclosure. FIG. 4A illustrates example details of a write counter table 40 before performing an inter-block collection wear leveling operation. In other words, the write counter table 40 shown in FIG. 4A illustrates the respective values of the respective write counters before swapping the physical locations of the data stored at the logical block addresses in a first logical block address collection and the physical locations of data stored at logical block address in a second logical block address collection. Similarly, FIG. 4B illustrates the respective values of the respective write counters after swapping the physical locations of the data stored at the logical block addresses in a first logical block address collection and the physical locations of data stored at logical block address in a second logical block address collection. For ease of illustration only, the data structure will be described as a write counter table 40; however, the information within write counter table 40 may be stored in any type of data structure, such as an array, database, or the like. For purposes of illustration, the write counter table 40 will be described with reference to FIGS. 1 and 3.

Write counter table 40 may store write counter values associated with each respective logical block address collection. For example, write counter table 40 may include "n" rows, one row for each logical block address collection. Each row may include a plurality of columns, each column including respective write counters associated with respective logical block address collections.

For example, write counter table 40 may include at least one of the columns Logical Block Address Collection 42, Physical Block Address Range 44, Transient Write Counter 46, Permanent Write Counter 48, or Total Count Value 50. In some examples, write counter table 40 may omit one or more of columns 42-50, may include other columns storing other information, or a combination thereof. Logical Block Address Collection 42 may include a unique logical block address identifier to identify the logical block address collection. Physical Block Address Range 44 may store an indication of the physical block addresses corresponding to the logical block address within the respective logical block address collection. Transient write counter 46 may store a count of the number of times data has been written to the respective logical block address collection over a certain amount of time (e.g., since the last wear leveling operation performed by controller 8 that involved the respective logical block address collection). Permanent write counter 48 may store a count of the number of times data has been written to the respective logical block address collection over the life of storage device 6, or over the life of storage device 6 prior to the last inter-block collection wear leveling operation involving the respective logical block address collection. Total Write Value 50 store a count of the total number of times data has been written to the respective logical block address collection. In some examples, WMM 30 may not actually store the Total Write Value 50 (e.g., in order to reduce the amount of memory required to store the counters) and may calculate the total number of times data has been written to a logical block address collection by summing the value of the respective transient write counter and the value of the respective permanent write counter.

In some examples, in response to determining that a device write counter satisfies a threshold, WMM 30 may determine whether to swap physical locations of the data stored at the logical block addresses in a first logical block address collection and the physical locations of data stored at logical block address in a second logical block address collection. WMM 30 may determine whether to swap based on the respective transient write counters 46, the respective permanent write counters 48, the total write value 50, or a combination thereof. In some examples, WMM 30 may determine whether to swap based on comparing the write counter (e.g., transient write counter 46, permanent write counter 48, or total write value 50) with the largest value to write counter with the largest value. In some instances, may determine which write counter stores the largest value and which write counter stores the smallest value by sorting the transient write count values 44 from largest to smallest. In other instances, WMM 30 may determine which write counter stores the largest value and which write counter stores the smallest value by utilizing a priority queue.

In some examples, WMM 30 may determine whether to swap physical locations based on the swapping conditions shown in Equations 3 and 4, as described above. Referring to FIG. 4A, WMM 30 may determine that the largest total write value 50 is associated with logical block address collection (#5) and that the smallest total write value 50 is associated with logical block address collection (#3). Thus, the value of the transient write counter associated with logical block address collection (#5) may be denoted as $C_{5,TRANS}$, the total write value associated with logical block address collection (#5) may be denoted as $C_{5,TOTAL}$, the value of the transient write counter associated with logical block address collection (#3) may be denoted as $C_{3,TRANS}$, and the total write value associated with logical block address collection (#3) may be denoted as $C_{3,TOTAL}$. Substituting into Equations 3 and 4 results in Equations 5 and 6:

$$C_{5,TOTAL} > P^* C_{3,TOTAL} \text{ and} \qquad \text{Equation 5:}$$

$$C_{5,TRANS} > C_{3,TRANS}. \qquad \text{Equation 6:}$$

If $C_{5,TRANS}=1100$, $C_{5,TOTAL}=5350$, $C_{3,TRANS}=50$, $C_{3,TOTAL}=550$, and the predetermined number P=2, WMM 30 may determine to swap the physical location of data stored at the logical block address in logical block address collection (#5) and the physical location of data stored at the logical block address in logical block address collection (#3) because both equations 5 and 6 are true. Thus, as illustrated by FIG. 4B, the physical location of data associated with logical block address collection (#5) may be swapped from physical block address range (9,10) to physical block address range (5,6). Similarly, the physical location of data associated with logical block address collection (#3) may be swapped from physical block address range (5,6) to physical block address range (9,10).

In a similar manner, WMM 30 may determine the second largest total write value, the second smallest total write value, and may determine whether to swap physical locations of the data associated with the second largest total write value and the second smallest total write value. Referring to FIG. 4A, WMM 30 may determine that the second largest total write value 50 is associated with logical block address collection (#1) and that the smallest total write value 50 is associated with logical block address collection (#2). Thus, the value of the transient write counter associated with logical block address collection (#1) may be denoted as $C_{1,TRANS}$, the total write value associated with logical block address collection (#1) may be denoted as $C_{1,TOTAL}$, the value of the transient write counter associated with logical block address collection (#2) may be denoted as $C_{2,TRANS}$, and the total write value associated with logical block address collection (#2) may be denoted as $C_{2,TOTAL}$. Substituting into Equations 3 and 4 results in Equations 7 and 8:

$$C_{1,TOTAL} > P^* C_{2,TOTAL} \text{ and} \qquad \text{Equation 7:}$$

$$C_{1,TRANS} > C_{2,TRANS} \qquad \text{Equation 8:}$$

If $C_{1,TRANS}=1200$, $C_{1,TOTAL}=3200$, $C_{2,TRANS}=200$, $C_{2,TOTAL}=600$, and predetermined number P=2, WMM 30 may determine to swap the physical location of data stored at the logical block address in logical block address collection (#1) and the physical location of data stored at the logical block address in logical block address collection (#2) because both equations 7 and 8 are true. Thus, as illustrated by FIG. 4B, the physical location of data associated with logical block address collection (#1) may be swapped from physical block address range (1,2) to physical block address range (3,4). Similarly, the physical location of data associated with logical block address collection (#2) may be swapped from physical block address range (3,4) to physical block address range (1,2).

WMM 30 may continue this process until there are no combinations of logical block address collections and write counters associated with the respective logical block address collections that satisfy the swapping equations.

In response to swapping physical locations of data stored at logical block addresses in a first logical block address collection and physical locations of data stored at logical block address in the second logical block address collection, WMM 30 may increase the value of the first permanent write counter associated with the first logical block address collection by the value of the first transient write counter. Similarly, WMM 30 may increase the value of the second permanent write counter associated with the second logical block address collection by the value of the second transient write counter. For example, WMM 30 may sum the respective values of the transient write counter and the respective values of the permanent write counter associated with logical block address collection (#5). Thus, WMM 30 may increase the value of the transient write counter associated with logical block address collection (#5) from 4250 to 5350. Similarly, WMM 30 may increase the value of the permanent write counters associated with logical block address collections (#s 1, 2, and 3).

In some examples, WMM 30 may swap the value of the respective permanent write counters and the value of the respective total write counters associated with each respective logical block address collection after summing the value of the respective transient write counter and the permanent write counter. For example, if $C_{5,PERM}$=5350 and $C_{3,PERM}$=550 after summing the respective transient write counters and the respective permanent write counters, WMM 30 may swap the value of the updated permanent write counters such that, after the swap, $C_{5,PERM}$=550 and $C_{3,PERM}$=5350. Thus, after the swap, the permanent write counter $C_{3,PERM}$ reflects the total number of writes to the physical block address range (9, 10) and the permanent write counter $C_{5,PERM}$ reflects the total number of writes to the physical block address range (5,6). In this way, permanent write counters 50 may correspond to the physical locations of the data and may track the actual number of writes to the respective physical block addresses.

In further response to swapping physical locations of data stored at logical block addresses in a first logical block address collection and physical locations of data stored at logical block address in the second logical block address collection, WMM 30 may update the respective transient write counters 46 by setting the value of the respective transient write counters to a baseline value (e.g., zero). For example, WMM 30 may set the value of the transient write counters associated with logical block address collections (#s 1, 2, 3, and 5) to zero.

Figure 5:
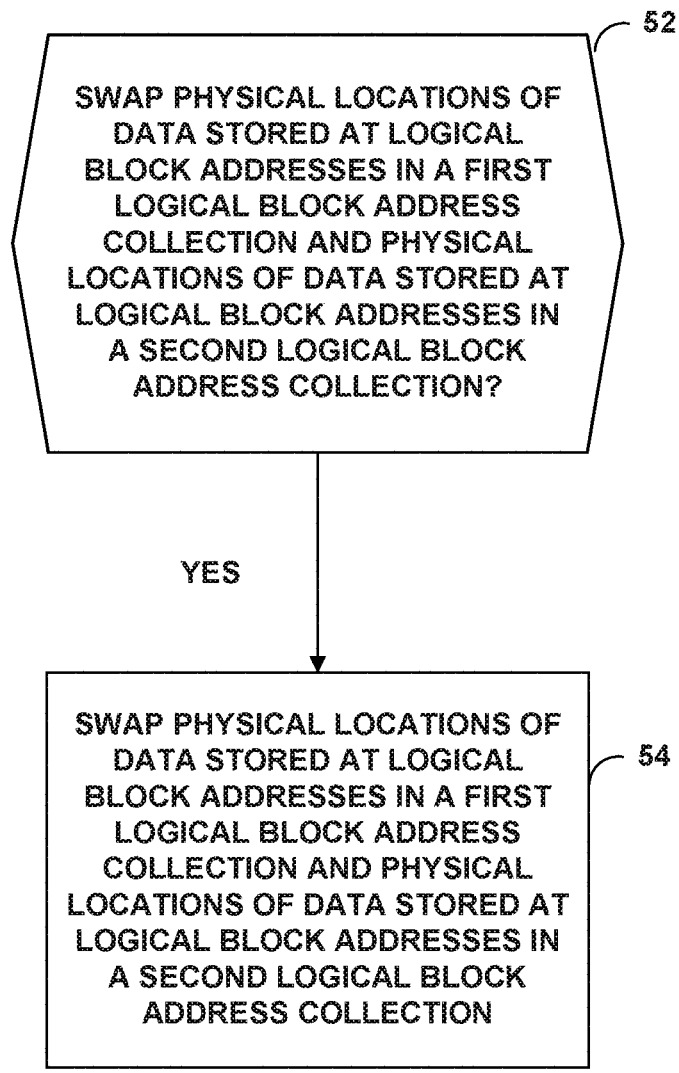
FIG. 5 is a flow diagram illustrating example wear leveling operations of a solid state drive.

FIG. 5 is a flow diagram illustrating example wear leveling operations of a solid state drive, in accordance with one or more techniques of this disclosure. For ease of illustration, the exemplary technique of FIG. 5 will be described with concurrent reference to storage device 6 and controller 8 of FIGS. 1 and 3. However, the techniques may be used with any combination of hardware or software.

WMM 30 may determine whether to swap physical locations of data stored at logical block addresses in a first logical block address collection and physical locations of data stored at logical block addresses in a second logical block address collection (52). In some examples, WMM 30 may determine whether to swap the physical locations of the data based on a value of a first transient write counter associated with the first logical block address collection and a value of a second transient write counter associated with the second logical block address collection. In other examples, WMM 30 may determine whether to swap the physical locations of the data based on the sum of the value of a first transient write counter and a first permanent write counter associated with the first logical block address collection, also referred to as the first total write value, and the sum of the value of a second transient write counter and a second permanent write counter associated with the second logical block address collection, also referred to as the second total write value. In other examples, WMM 30 may determine whether to swap the physical locations of data based on the first transient write value and the first total write value associated with the first logical block address collection, and the second transient write value and the second total write value associated with the second logical block address collection.

In response to determining to swap the physical locations of the data stored at logical block addresses in the first logical block address collection and the physical locations of the data stored at logical block addresses in the second logical block address collection, WMM 30 may swap the physical locations of the data stored at logical block addresses in the first logical block address collection and the physical locations of the data stored at logical block addresses in the second logical block address collection (54). For example, WMM 30 may copy data stored at a first physical location associated with the first transient write counter to a third physical location (e.g., a different memory device 16 or volatile memory 12), copy data stored at the second physical location associated with the second transient write counter to the first physical location, and copy the data from the third physical location to the second physical location.

Figure 6:
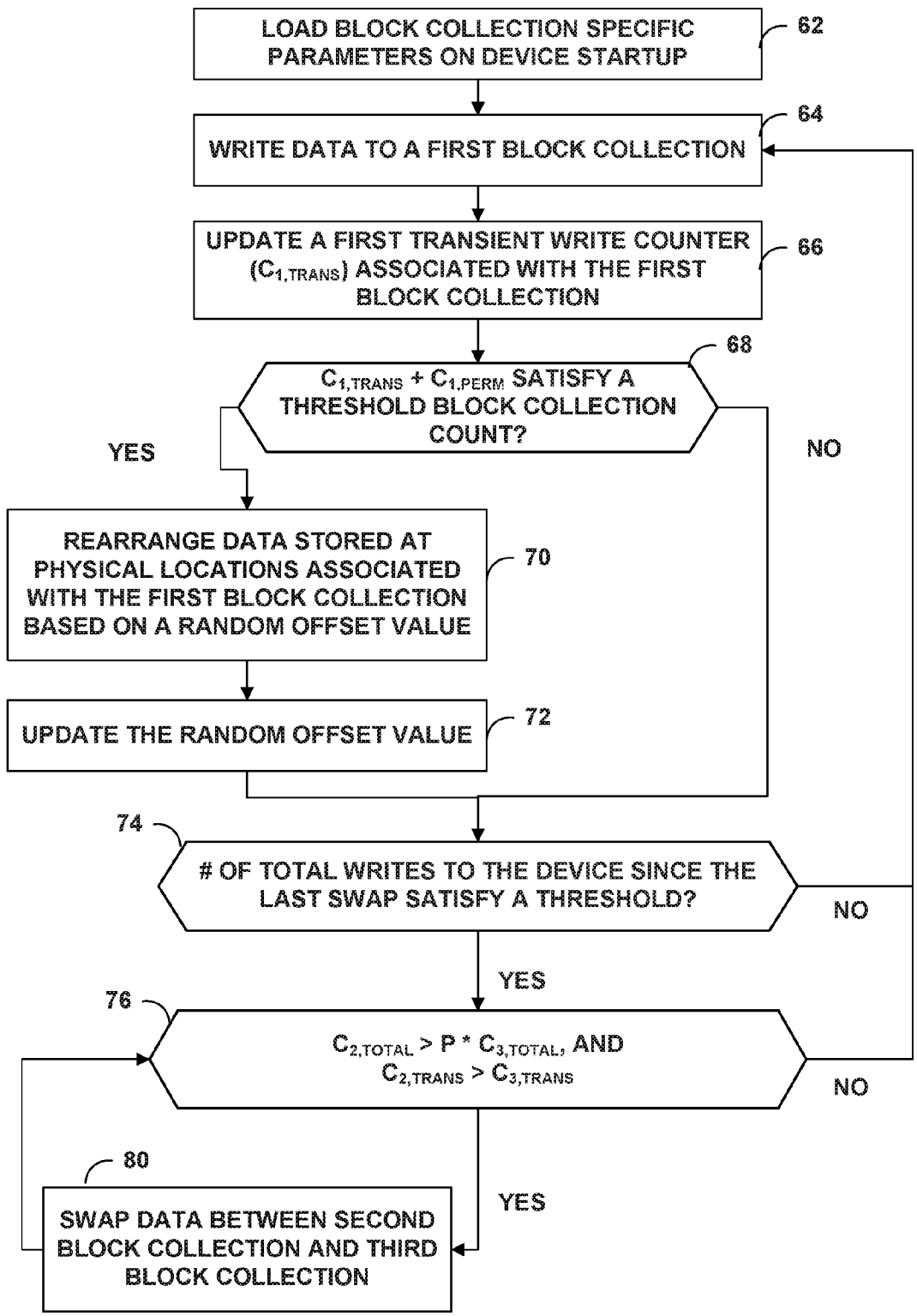
FIG. 6 is a flow diagram illustrating example wear leveling operations of a solid state drive.

FIG. 6 is a flow diagram illustrating example wear leveling operations of a solid state drive, in accordance with one or more techniques of this disclosure. For ease of illustration, the exemplary technique of FIG. 7 will be described with concurrent reference to storage device 6 and controller 8 of FIGS. 1 and 3. However, the techniques may be used with any combination of hardware or software.

In some examples, WMM 30 may load block collection specific parameters on devices startup (62). For example, WMM 30 may retrieve a plurality of transient write counters that are each associated with a respective logical block address collection of a plurality of logical block address collections, a plurality of permanent write counters that are each associated with a respective logical block address collection of the plurality of logical block address collections, or both. WMM 30 may load the plurality of transient write counters and/or permanent write counters to volatile memory 12. In some examples, the plurality of transient and/or permanent write counters may include the respective of transient and/or permanent write counters corresponding to the most frequently written logical block address collections, the most frequently read logical block address collections, or both.

Write module 24 may write data to a first logical block address collection (64). For example, write module 24 may receive a write command from host device 4 that includes data and a logical block address, select a physical location (e.g., a PBA) within a particular memory device 16 to store the data, and store the data to the selected physical location. In some examples, WMM 30 may determine a first logical block address collection that includes the logical block address. In response to writing the data to the first physical location, WMM 30 may update a first transient write counter ($C_{1,TRANS}$) associated with the first logical block address collection (66). For example, WMM 30 may increase by one the value of the first transient write counter.

In some examples, WMM 30 may determine whether to rearrange data stored at physical locations associated with the first logical block address collection based on a sum of the first transient write counter ($C_{1,TRANS}$) and the first permanent write counter ($C_{1,PERM}$) associated with the first logical block collection. For example, WMM 30 may determine whether a total number of writes to the first logical block address collection ($C_{1,TRANS}+C_{1,PERM}$) satisfies a threshold block collection count (68). In some examples, WMM 30 may determine that the total number of writes to the first logical block address collection satisfies a threshold block collection count if the total number of writes to the first logical block address collection is equal to or exceeds one of a plurality of threshold block collection counts. In other examples, WMM 30 may determine that the total number of writes to the first logical block address collection satisfies a threshold block collection count if the total number of writes to the second logical block address collection is divisible by an integer.

In response to determining that the total number of writes to the first logical block address collection satisfies a threshold block collection count, WMM 30 may rearrange data stored at physical locations associated with the first logical block address collection based on a random offset value (70). For example, WMM 30 may rearrange the data stored at physical locations associated with the first logical block address collection by swapping the physical location of data stored at a first logical address (e.g., a logical page word, or byte) associated with the first logical block address collection and a physical location of data stored at a second logical address (e.g., a logical page or word) associated with first logical block address collection. In some examples, WMM 30 may perform the swap based on a random offset value associated with the first logical block address collection. For example, WMM 30 may swap data from a first physical location to a second physical location that is offset from the first physical location by the random offset value.

WMM 30 may update the random offset value (72). For example, WMM 30 may generate a random number and may set the random offset value equal to the value generated by the random number generator.

In some examples, WMM 30 may determine whether a total number of writes to storage device 6 since the last swap (e.g., the most recent inter-block collection wear leveling) satisfies a threshold number of writes (74). In some instances, WMM 30 may determine that the total number of writes to storage device 6 since the swap satisfies a threshold if a value of a device write counter is equal to one of a plurality of threshold device write counts. In other instances, WMM 30 may determine that the device write counter satisfies the threshold if the value of the device write counter is greater than or equal to a threshold device write count. In yet other instances, WMM 30 may determine that the total number of writes to storage device 6 since the last swap satisfies a threshold if the device write counter is divisible by an integer.

In response to determining that the total number of writes to storage device 6 satisfies the threshold number of writes, WMM 30 may determine whether to swap the physical locations of the data stored at logical block addresses in the second logical block address collection and the physical locations of the data stored at logical block addresses in the third logical block address collection. WMM 30 may determine whether to swap the physical locations of the data by determining whether a total write value associated with second block collection ($C_{2,TOTAL}$) is greater than a predetermined number P multiplied by the total write value associated with a third block collection ($C_{3,TOTAL}$) and whether a transient write counter associated with second block collection ($C_{2,TRANS}$) is greater than a transient write counter associated with the third block collection ($C_{3,TRANS}$) (76).

In response to determining that $C_{2,TOTAL} > P^*C_{3,TOTAL}$ and $C_{2,TRANS} > C_{3,TRANS}$, WMM 30 may swap the physical locations of the data stored at logical block addresses in the second logical block address collection and the physical locations of the data stored at logical block addresses in the third logical block address collection (80). For example, WMM 30 may copy data stored at a first physical location associated with the first transient write counter to a third physical location (e.g., a different memory device 16 or volatile memory 12), copy data stored at the second physical location associated with the second transient write counter to the first physical location, and copy the data from the third physical location to the second physical location. WMM 30 may cause address translation module 22 to update the flash translation layer or indirection table to indicate that the first logical block address collection now corresponds to the second physical location and that the second logical block address collection now corresponds to the first physical location.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A system comprising: a plurality of memory devices comprising a plurality of physical locations at which data is stored; a processor configured to: determine, based on a value of a first transient write counter associated with a first logical block address collection and a value of a second transient write counter associated with a second logical block address collection, whether to swap physical locations of data stored at logical block addresses in the first logical block address collection and physical locations of data stored at logical block addresses in the second logical block address collection, wherein: the value of the first transient write counter equals a number of times data has been written to the first logical block address collection since a prior data swap involving the first logical block address collection, and the value of the second transient write counter equals a number of times data has been written to the second logical block address collection since a prior data swap involving the second logical block address collection; and in response to determining to swap the physical locations of the data stored at logical block addresses in the first logical block address collection and the physical locations of the data stored at logical block addresses in the second logical block address collection: swap the physical locations of the data stored at the logical block addresses in the first logical block address collection and the physical locations of the data stored at the logical block addresses in the second logical block address collection; and wherein the processor is configured to determine whether to swap physical locations of the data stored at logical block addresses in the first logical block address collection and physical locations of the data stored at logical block addresses in the second logical block address collection by at least: summing the value of the first transient write counter with a value of a first permanent write counter associated with the first logical block address collection to determine a first total write value indicating a total number of writes to the first logical block address collection, wherein the value of the first permanent write counter equals the number of times data was written to the first logical block address collection before a prior data swap involving the first logical block address collection; summing the value of the second transient write counter with a value of a second permanent write counter associated with the second logical block address collection to determine a second total write value indicating a total number of writes to the second logical block address collection, wherein the value of the second permanent write counter equals the number of times data was written to the second logical block address collection before a prior data swap involving the second logical block address collection; and determining whether the first total write value is greater than a predetermined number multiplied by the second total write value.

2. The system of claim 1, wherein the processor is configured to determine whether to swap physical locations of the data stored at logical block addresses in the first logical block address collection and physical locations of the data stored at logical block addresses in the second logical block address collection by at least:
determine whether the value of the first transient write counter is greater than a predetermined number multiplied by the value of the second transient write counter.

3. The system of claim 1, wherein the processor is further configured to:
in response to determining that a sum of the value of the first transient write counter and a value of a first permanent write counter associated with the first logical block address collection exceeds a threshold block collection write count, rearrange, based on an offset value associated with the first logical block address collection, physical locations of data stored at logical addresses associated with the first logical block address collection; and
update the offset value associated with at least the first logical block address collection.

4. The system of claim 1, wherein, the processor is further configured to, in response to determining to swap physical locations of the data stored at logical block address in the first logical block address collection and physical locations of the data stored at logical block addresses in the second logical block address collection:
increase a value of a first permanent write counter associated with the first logical block address collection by the value of the first transient write counter; and
increase a value of a second permanent write counter associated with the second block collection by the value of the second transient write counter.

5. The system of claim 1, further comprising:
a data storage device comprising:
the plurality of memory devices; and
the processor.

6. The system of claim 1, further comprising:
a data storage device comprising the plurality of memory devices; and
a host device comprising the processor.

7. The system of claim 1, wherein the processor is further configured to:
in further response to determining to swap the physical locations of the data stored at logical block addresses in the first logical block address collection and the physical locations of the data stored at logical block addresses in the second logical block address collection:
set the value of the first transient counter and the value of the second transient write counter equal to a baseline value.

8. A method comprising: determining, by a processor, based on a value of a first transient write counter associated with a first logical block address collection and a value of a second transient write counter second logical block address collection associated, whether to swap physical locations of data stored in the first logical block address collection and physical locations of data stored in the second logical block address collection, wherein: the value of the first transient write counter equals a number of times data has been written to the first logical block address collection since a prior data swap involving the first logical block address collection, and the value of the second transient write counter equals a number of times data has been written to the second logical block address collection since a prior data swap involving the second logical block address collections and in response to determining to swap the physical locations of the data stored at logical block addresses in the first logical block address collection and the physical locations of the data stored at logical block addresses in the second logical block address collection: causing, by the processor, the physical locations of the data stored at the logical block addresses in the first logical block address collection to be swapped with the physical locations of the data stored at the logical block addresses in the second logical block address collection; and
wherein determining whether to swap physical locations of the data stored at logical block addresses in the first logical block address collection and physical locations of the data stored at logical block addresses in the second logical block address collection comprises:
summing, by the processor, the value of the first transient write counter with a value of a first permanent write counter associated with the first logical block address collection to determine a first total write value indicating a total number of writes to the first logical block address collection, wherein the value of the first permanent write counter equals the number of times data was written to the first logical block address collection before a prior data swap involving the first logical block address collection; summing, by the processor, the value of the second transient write counter with a value of a second permanent write counter associated with the second logical block address collection to determine a second total write value indicating a total number of writes to the second logical block address collection, wherein the value of the second permanent write counter equals the number of times data was written to the second logical block address collection before a prior data swap involving the second logical block address collection; and determining, by the processor, whether the first total write value is greater than a predetermined number multiplied by the second total write value.

9. The method of claim 8, wherein determining whether to swap physical locations of the data stored at logical block addresses in the first logical block address collection and physical locations of the data stored at logical block addresses in the second logical block address collection comprises:
   determining, by the processor, whether the value of the first transient write counter is greater than a predetermined number multiplied by the value of the second transient write counter.

10. The method of claim 8, further comprising:
   in response to determining that a sum of the value of the first transient write counter and a value of a first permanent write counter associate with the first logical block address collection exceeds a threshold block collection write count, rearranging, by the processor and based on an offset value associated with the first logical block address collection, physical locations of data stored at logical addresses associated with the first logical block address collection; and
   updating, by the processor, the offset value associated with at least the first logical block address collection.

11. The method of claim 8, further comprising:
   in response to determining to swap physical locations of the data stored at logical block address in the first logical block address collection and physical locations of the data stored at logical block addresses in the second logical block address collection:
      increasing, by the processor, a value of a first permanent write counter associated with the first logical block address collection by the value of the first transient write counter; and
      increasing, by the processor, a value of a second permanent write counter associated with the second block collection by the value of the second transient write counter.

12. The method of claim 8, wherein determining whether to swap the physical locations of the data stored at logical block addresses in the first logical block address collection and the physical locations of data stored at logical block addresses in the second logical block address collection is in response to determining, by the processor, that a value of a device write counter satisfies a threshold device write count.

13. The method of claim 8, further comprising:
   in further response to determining to swap the physical locations of the data stored at logical block addresses in the first logical block address collection and the physical locations of the data stored at logical block addresses in the second logical block address collection:
      setting, by the processor, the value of the first transient counter and the value of the second transient write counter equal to a baseline value.

\* \* \* \* \*